(12) United States Patent  (10) Patent No.: US 8,053,359 B2
Bao et al.  (45) Date of Patent: Nov. 8, 2011

(54) SEMICONDUCTOR DEVICE HAVING A SECOND LEVEL OF METALLIZATION FORMED OVER A FIRST LEVEL WITH MINIMAL DAMAGE TO THE FIRST LEVEL AND METHOD

(75) Inventors: Tien-I Bao, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/765,662

(22) Filed: Apr. 22, 2010

(65) Prior Publication Data

US 2010/0203722 A1 Aug. 12, 2010

Related U.S. Application Data

(60) Division of application No. 11/497,595, filed on Aug. 2, 2006, now Pat. No. 7,732,326, which is a continuation-in-part of application No. 10/800,510, filed on Mar. 15, 2004, now abandoned.

(60) Provisional application No. 60/547,697, filed on Feb. 25, 2004.

(51) Int. Cl.
  *H01L 21/4763* (2006.01)
(52) U.S. Cl. ................................ 438/638; 257/E23.145
(58) Field of Classification Search .................. 438/623, 438/624, 637, 638; 257/E23.145
  See application file for complete search history.

(56) References Cited

U.S. PATENT DOCUMENTS

| | | | | |
|---|---|---|---|---|
| 5,854,131 | A | * | 12/1998 | Dawson et al. ............... 438/666 |
| 6,054,379 | A | * | 4/2000 | Yau et al. ...................... 438/623 |
| 6,071,809 | A | * | 6/2000 | Zhao ............................. 438/634 |
| 6,077,774 | A | | 6/2000 | Hong et al. |
| 6,117,793 | A | | 9/2000 | Tang |
| 6,146,987 | A | | 11/2000 | Wang et al. |
| 6,153,514 | A | | 11/2000 | Wang et al. |
| 6,291,334 | B1 | | 9/2001 | Somekh |
| 6,417,090 | B1 | | 7/2002 | Wang et al. |
| 6,424,021 | B1 | | 7/2002 | Liu et al. |
| 6,472,317 | B1 | | 10/2002 | Wang et al. |
| 6,475,810 | B1 | * | 11/2002 | Zhou et al. .................... 438/633 |
| 2002/0140103 | A1 | | 10/2002 | Kloster et al. |
| 2003/0129844 | A1 | | 7/2003 | Wang et al. |
| 2004/0058547 | A1 | | 3/2004 | Morrow et al. |
| 2004/0084680 | A1 | | 5/2004 | Ruelke et al. |
| 2004/0087171 | A1 | | 5/2004 | Cohen |

FOREIGN PATENT DOCUMENTS

| | | |
|---|---|---|
| TW | 366565 | 8/1999 |
| TW | 416122 | 12/2000 |
| TW | 544895 | 8/2003 |
| TW | 577144 | 2/2004 |
| TW | 577145 | 2/2004 |
| WO | WO 01/26145 A1 | 4/2001 |

* cited by examiner

*Primary Examiner* — David Zarneke
*Assistant Examiner* — Jenny L. Wagner
(74) *Attorney, Agent, or Firm* — Slater & Matsil, L.L.P.

(57) ABSTRACT

A method for processing a semiconductor structure includes the steps of capping a top surface of the semiconductor structure that defines the metallization layer with a thin stop layer, forming a dielectric layer over the thin stop layer, wherein the dielectric layer defines at least one area where the thin stop layer is exposed, and removing the exposed thin stop layer to expose a top surface of the metallization layer using etchant gases substantially free from oxygen, so that the metallization layer is substantially free of damage.

13 Claims, 4 Drawing Sheets

*FIG. 2F*

SEMICONDUCTOR DEVICE HAVING A SECOND LEVEL OF METALLIZATION FORMED OVER A FIRST LEVEL WITH MINIMAL DAMAGE TO THE FIRST LEVEL AND METHOD

This application is a divisional of U.S. patent application Ser. No. 11/497,595, filed Aug. 2, 2006, entitled "Semiconductor Device Having a Second Level of Metallization Formed over a First Level with Minimal Damage to the First Level and Method," which application is a continuation-in-part of U.S. patent application Ser. No. 10/800,510, filed Mar. 15, 2004, entitled "Semiconductor Device Having a Second Level of Metallization Formed over a First Level with Minimal Damage to the First Level and Method," which application claims the benefit of Provisional Patent Application Ser. No. 60/547,697, filed Feb. 25, 2004, entitled "Semiconductor Device Having a Second Level of Metallization Formed over a First Level with Minimal Damage to the First Level and Method," which applications are incorporated herein by reference.

TECHNICAL FIELD

This invention relates generally to semiconductor processing, and more particularly to a method of forming a second level of metallization that contacts a first level of metallization with minimal damage to the first level resulting from opening a dielectric used to pattern the second level.

BACKGROUND

As is well known by those skilled in the art, a continuing goal in the manufacture and production of semiconductors is a reduction in the size of components and circuits with the concurrent result of an increase in the number of circuits and/or circuit elements, such as transistors, capacitors, etc., on a single semiconductor device. This relentless and successful reduction in size of the circuit elements has also required reduction in the size of the conductive lines connecting devices and circuits.

In the past, aluminum was used for metal interconnect lines and silicon oxide was used for the dielectric. However, newer manufacturing techniques now favor copper as the metal for forming interconnect lines and various low K materials (organic and inorganic) for forming the dielectric material. Not surprisingly, these material changes have required changes in the processing methods. In particular, because of the difficulty of etching copper without also causing unacceptable damage to the copper and/or dielectric material, the technique of forming the metal interconnect lines has experienced significant changes. Namely, whereas aluminum interconnects could be formed by depositing a layer of aluminum and then using photoresist, lithography, and etching to leave a desired pattern of aluminum lines, copper interconnect lines are typically formed by a process now commonly referred to as a damascene process. The damascene process is almost the reverse of etching. Simply stated, a trench, canal or via is cut, etched or otherwise formed in the underlying dielectric and is then filled with metal (i.e., copper).

The damascene process has allowed even further reductions in the size of interconnect lines and the space between the interconnect lines. Unfortunately, as the space between the interconnecting lines has decreased, the line-to-line capacitance has increased.

As stated above, the change in materials and processing steps has resulted in a new set of manufacturing challenges. For example, the patterning and etching of the dielectric layer that supports and surrounds a via interconnecting an upper or second metallization layer to a lower metallization level, and then the removal of the resist or hard mask by the typical "ashing" process often results in considerable damage to the top surface of the copper of the lower metallization level at the point of the interconnection. This damage may result in decreased yields, and, therefore, etching techniques and the method of removal of the resist need some adjustments.

SUMMARY OF THE INVENTION

These and other problems are generally solved or circumvented, and technical advantages are generally achieved, by embodiments of the present invention, which provide semiconductor devices and methods of manufacturing the semiconductor devices having an upper level of metallization interconnected to a lower level of metallization. Unlike the prior art processes, the processes of the present invention provide for an interconnection between the two levels of metallization with minimal damage to the lower metallization level.

In accordance with an embodiment of the present invention, a method for processing a semiconductor structure defining a metallization layer which results in said metallization layer being substantially free of damage includes the steps of capping a top surface of the semiconductor structure that defines the metallization layer with a thin stop layer, forming a dielectric layer over the thin stop layer, wherein the dielectric layer defines at least one area where the thin stop layer is exposed, and removing the exposed thin stop layer to expose a top surface of said metallization layer using etchant gases free from oxygen, so that the metallization layer is substantially free of damage.

A method of forming an upper level of metallization in a semiconductor device with reduced damage to a lower level of metallization includes providing a substrate having a top surface, said top surface defining said lower level of metallization, capping said lower level of metallization with a stop layer deposited to a thickness of less than 100 Å over said top surface, depositing an inter-metal dielectric (IMD) layer over said stop layer, depositing and patterning a resist layer to define a patterned mask over said IMD layer, etching an upper portion of said IMD layer to remove material according to said patterned mask using an oxygen-containing etchant gas, etching a lower portion of said IMD layer to remove material according to said patterned mask using an oxygen-free etchant gas to expose said stop layer, removing said resist layer, removing said exposed stop layer using an etchant gas free from oxygen, and filling said layout etched in said IMD layer with a metal to form said upper level of metallization.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
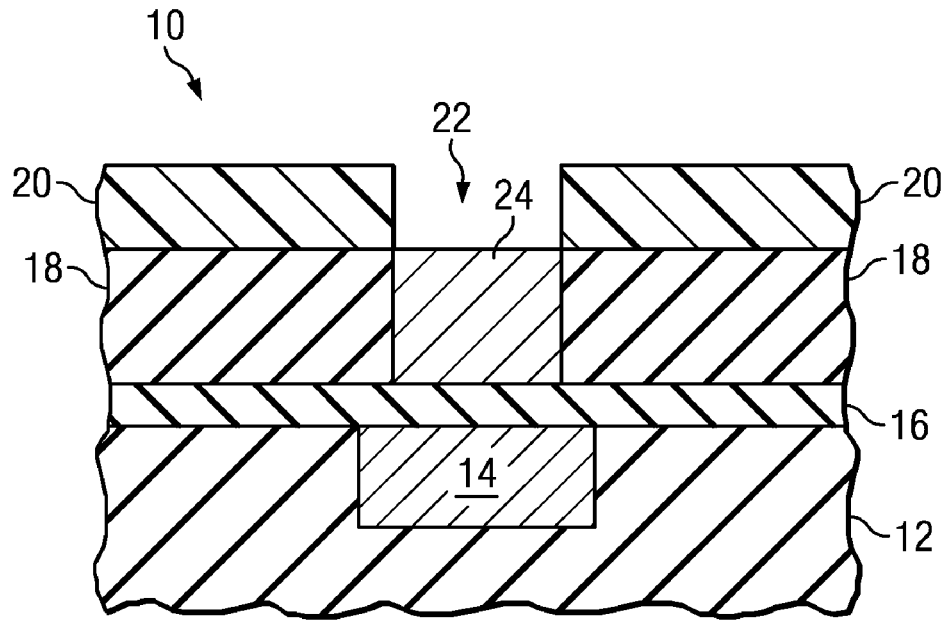
FIG. 1A illustrates a prior art method of providing a thick capping layer over a lower level of copper followed by an IMD layer and a patterned resist layer.

Referring now to FIG. 1A, there is shown a typical prior art semiconductor structure including a substrate 10 having a first layer of non-conductive or dielectric material 12 and at least one conductive or interconnect region 14, such as copper metallization or lines. It should be appreciated that the term substrate 10 as used herein may represent one or more layers of various semiconductor devices including interconnecting metallization layers. Thus, the term substrate is intended to be broadly interpreted.

Figure 1B:
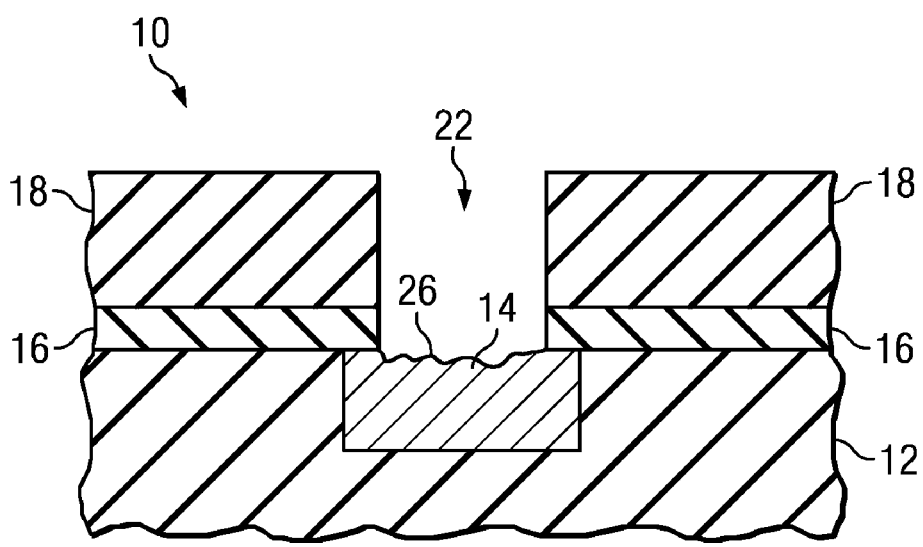
FIG. 1B illustrates the damaged lower level copper layer of metallization that results from prior art methods of etching the IMD layer and removing the patterned resist layer using an "ashing" process.

Further, according to the prior art, it is typical to include a thick capping layer 16 to be used as an etch stop or a diffusion over conductive regions 14 of a material such as silicon nitride if still another layer of metallization is to be formed over the first layer of dielectric material 12 and first conductive regions 14. Thick capping layer 16 is typically deposited to a thickness substantially greater than 300 Å. A second layer of dielectric 18, commonly referred to as an ILD (Inter-Layer Dielectric) or IMD (Inter-Metal Dielectric), is then deposited over the thick capping layer 16. A layer of resist 20, such as a photoresist, is then deposited over IMD layer 18 and patterned to define apertures such as trenches for interconnect lines and at least one via in the second layer or IMD layer 18 that will comprise the second or upper level of metallization. The patterned resist layer 20 is then used as a hard mask to etch the pattern or layout of the second level of metallization in IMD layer 18, including, for example, via 22 that is etched completely through dielectric layer 18, as indicated by the shaded cross-hatch portion 24 of IMD layer 18. The patterned resist layer 20 and the thick capping layer 16 at the bottom of via 22 is then typically removed by an oxidation process at a high temperature commonly referred to as an "ashing" process as is well known by those skilled in the art. The apertures, including via 22 defined in IMD layer 18, are then filled with a conductive metal such as copper. However, referring now to FIG. 1B, and as will also be appreciated by those skilled in the art, the opening or etching of dielectric layer 18 and the ashing process steps discussed above often result in substantial damage to the top surface 26 of the first conductive regions 14 as shown. This damage to top surface 26 may result in an unsatisfactory contact to a copper interconnect formed by via 22 filling between the first conductive regions 14, also referred to as the first lower level of metallization 14, and a second or upper level of metallization.

Figure 2A:
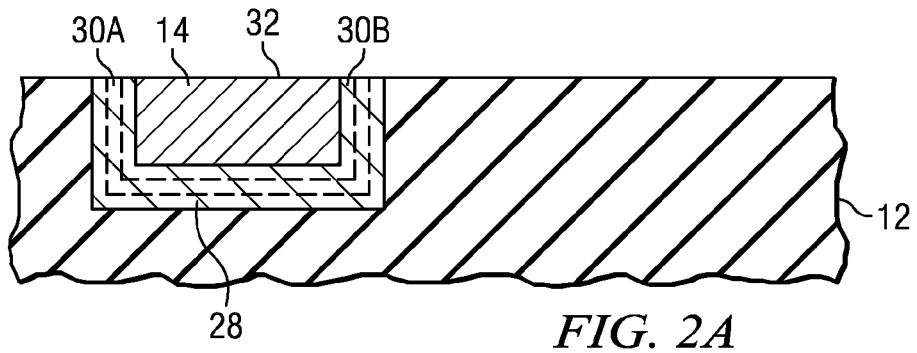
FIGS. 2A-2F illustrate the formation of a second level of metallization over a first level of metallization on a semiconductor device according to the methods that reduce damage to the first level as taught by the present invention.

Referring now to FIGS. 2A-2F and FIGS. 3A and 3B, there is illustrated a process for eliminating or substantially reducing such damage to the interconnect between an upper and a lower level of metallization. Elements of FIGS. 2A-2F that are the same as elements in FIGS. 1A and 1B carry the same reference numbers. As is well known by those skilled in the art, and as was discussed above, the use of a damascene process and the use of metals such as copper for the interconnecting layers has created various new problems not experienced with the older etched aluminum process for forming a metallization layer. For example, still another problem experienced when the conducting or interconnecting lines 14 are made of copper or copper containing materials, is that the copper may diffuse into the surrounding non-conductive dielectric layer 12 or substrate 10 if steps are not taken to prevent such diffusion. Thus, as shown in FIG. 2A, there may also be included a barrier layer 28, which stops or hinders the diffusion of the copper ions from the copper conductive regions 14 into the surrounding non-conductive dielectric portions or regions 12 of the substrate 10. Suitable barrier layers are well known in the art and include, for example only, Ta (tantalum), TaN (tantalum nitride), Ti (titanium), TiN (titanium nitride), and various combinations of these and other materials. Thus, when this barrier layer 28 is provided, diffusion of the copper in conductive regions 14 into the surrounding materials is slowed if not substantially eliminated.

Further, it is often advantageous to include at least one metal seed layer 30. Although a single seed layer may be sufficient, a preferable technique is to deposit a first metal seed layer 30a, which may be substantially non-conformal to the trenches supporting conductive regions 14. Metal seed layer 30a is then followed by a second seed layer 30b that provides substantially smooth surfaces. It is not necessary, however, that both seed layers be made of the same material. As an example, either one or both of the seed layers may be selected from such materials as Cu (Copper), Al (Aluminum), Ag (Silver), Au (Gold), W (Tungsten) and TaN (Tantalum Nitride). Likewise, both the first and second seed layers may be deposited by a same deposition method or a different method, as appropriate. Suitable methods include PVD (Plasma Vapor Deposition), CVD (Chemical Vapor Deposition), ALD (Atomic Layer Deposition) and/or ECP (Electro Chemical Process). The apertures, trenches and vias are then filled with the metallization metal (such as copper for example).

Then, according to the present invention, instead of a thick capping layer (greater than 300 Å) as was used in the prior art, a thin (less than 300 Å) stop layer 32 is deposited as an etch stop or diffusion stop. Preferably, stop layer 32 is deposited to a thickness of about 100 Å or less, for example, between about 50 Å and about 300 Å. Stop layer 32 may be organic or inorganic and suitable materials for use as stop layer 32 may be metal or non-metal and include silicon, nitrogen, carbon, oxygen and/or hydrogen containing materials such as SiC, SiCN, SiCO, SiN, SiO, SiOCH and other carbon-like materials. The materials of stop layer 32 are preferably selected so that in a subsequent etching process, a non-oxygen etchant can be used to etch stop layer 32. Further, as will be appreciated by those skilled in the art, stop layer 32 may be multi-layered and deposited in more than one step, and the various multi-layers may be of different suitable materials. Suitable methods for depositing a single or multi stop layer 32 of selected suitable materials include a PVD (Plasma Vapor Deposition) process, a CVD (Chemical Vapor Deposition) process, an ALD (Atomic Layer Deposition) process, and an Ion Beam Deposition process. Further, thin layer 32 is preferably deposited at a temperature of between about 200° C. and 500° C.

Figure 2B:
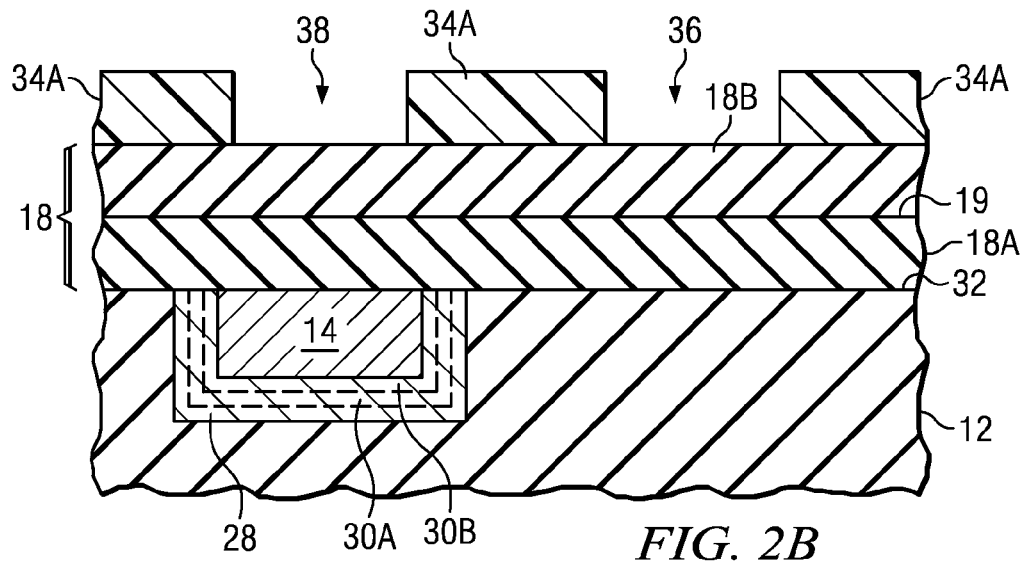

Referring now to FIG. 2B, the deposition of stop layer 32 is followed by the deposition of a dielectric, or IMD, layer 18, after which dielectric layer 18 is covered by a resist, which is patterned to define apertures such as trenches and vias in IMD layer 18. Depending on the selected damascene process, dielectric layer 18 may be comprised of a first layer, such as IMD (inter-metal dielectric) layer 18a, an etch stop layer 19 and a second dielectric layer 18b.

Figure 2C:
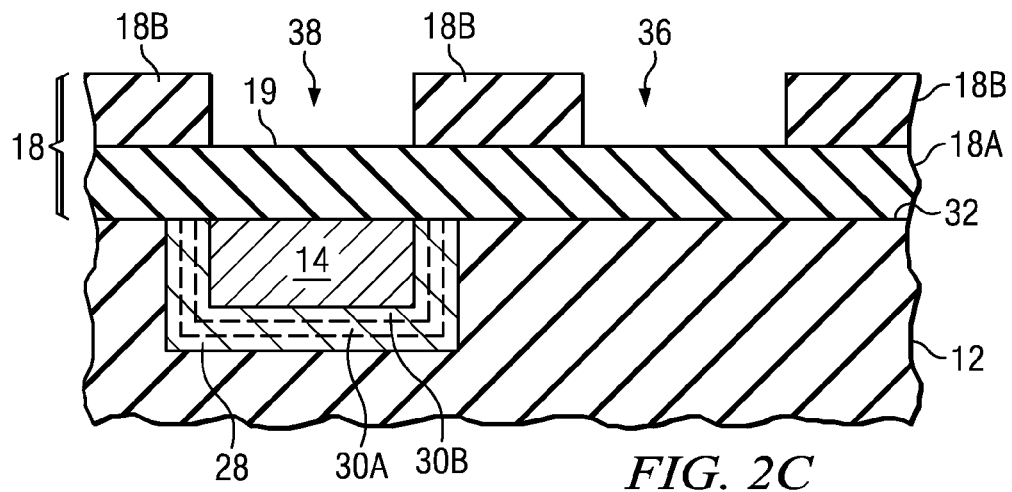
Figure 2D:
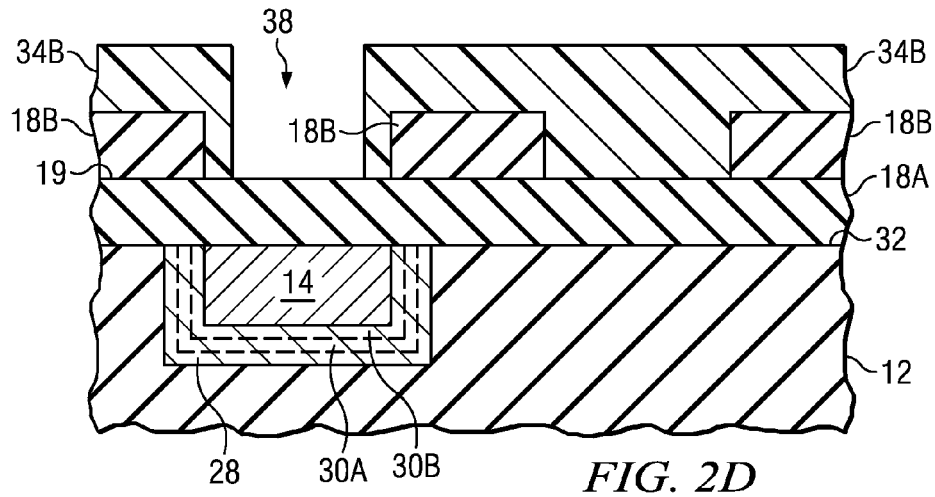
Figure 2E:
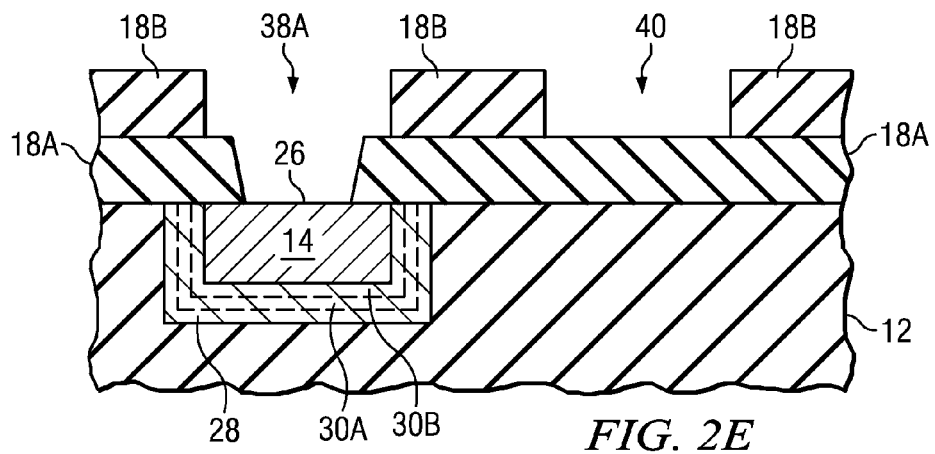
Figure 2F:
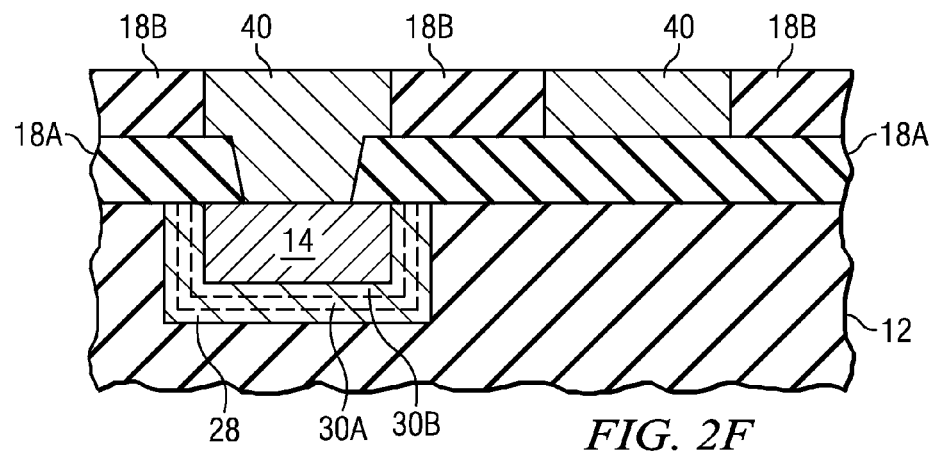

For example only, referring again to FIG. 2B, a first layer of resist 34a is patterned to define apertures or trenches 36 and 38 on the top of IMD layer 18b. It should be noted that trench 38 is located directly above conductive regions 14. The trenches 36 and 38 are then etched through dielectric layer 18b down to etch stop layer 19 and the first layer of resist 34a is stripped as shown in FIG. 2C. Then, according to one embodiment of the invention, a second layer of resist 34b is deposited over the IMD layer 18b, which fills the etched trenches 36 and 38. The second layer of resist 34b is then patterned to define the location of at least one interconnect via as shown in FIG. 2D. Layer 18a is then further etched such that via 38a extends completely through the IMD layer 18b and dielectric layer 18a. Preferably, during the etching of layers 18b and an upper portion of 18a, $O_2$ and/or $F_2$ containing gases, such as $C_4F_8$, $C_5F_8$, $CHF_3$, and combinations thereof, can be used as etchants. An oxygen-free etchant is then used to etch a lower portion (the remaining portion) of IMD layer 18a. The lower portion of IMD layer 18a is preferably as thin as possible, providing that even if a process variation occurs and IMD layer 18a is etched through, stop layer 32 will not be etched through. Stop layer 32 may be etched through during the etching of the lower portion of layer 18a, depending on the thickness of stop layer 32. If the thickness of stop layer 32 is less than about 100 Å, it is likely that it will be etched through, while if the thickness is greater, for example, about 300 Å, it is unlikely that it will be etched through. In an exemplary embodiment, the bottom portion of IMD layer 18a preferably has a thickness of less than about 400 Å. In another exemplary embodiment, with a better control of etching the upper portion of IMD 18a, the lower portion of IMD layer 18a may even be less than 200 Å, such as between about 100 Å and 200 Å. The etching of the upper portion and lower portion of IMD layer 18a is preferably performed using time-mode, during which stop layer 32 acts as a barrier layer, which prevents $O_2$ and/or $F_2$ containing gases that may be used in the etching of the upper portion of IMD layer 18a from penetrating it to reach and damage the underlying copper conductive regions 14.

After the etching of IMD layers 18b and 18a is complete, the resist layer 34b and the remaining portion of stop layer 32 is stripped and/or removed. Preferably, the removal of stop layer 32 is performed in an oxygen-free environment so that the underlying copper conductive region 14 is not oxidized. The preferred removal method includes dry etching, and the preferred process gases include $CF_4$, $CHF_3$, $CH_2F_2$, and combinations thereof. Since non-oxygen etchants are used for the removal of stop layer 32, no oxidation occurs to the conductive region 14. Accordingly, there is substantially no copper oxide removed in the subsequent pre-metal cleaning step, and thus the underlying conductive region 14 is substantially damage-free. Removal of the resist and exposed stop layer is typically performed using an ashing process to produce the structure shown in FIG. 2E. It is important to note at this point that the top surface 26 of conductive region 14 is not damaged as occurred in the prior art processes. The trenches 36 and 38 and the via 38a are then filled with a metal such as copper 40 according to the dual damascene process to produce the structure of FIG. 2F.

Figure 3A:
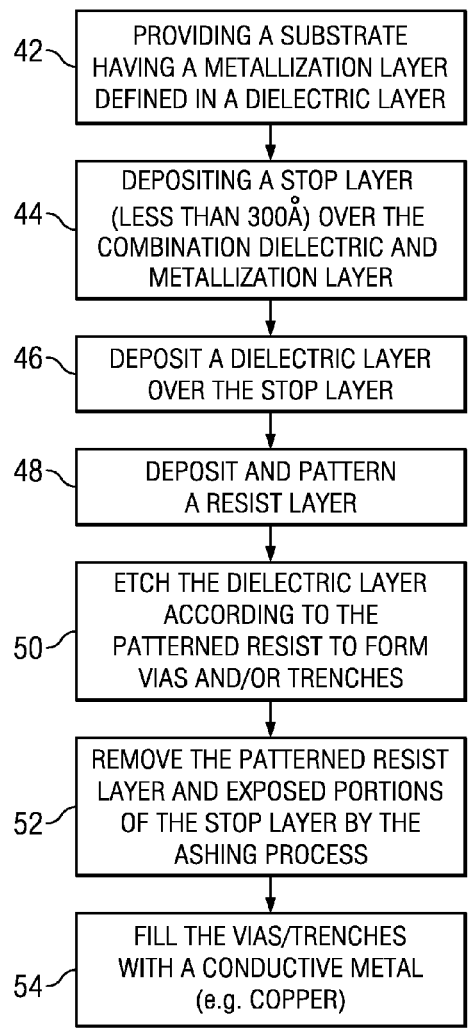
FIGS. 3A-3B show a flow chart illustrating the process steps of the present invention.

Referring to FIG. 3A, there is illustrated a flow diagram of the process of the present invention as discussed above. As shown, substrate 10 having a dielectric layer 12 defining the copper or metallization layer 14 is provided as shown by process step 42. Then, according to the present invention, a stop layer 32 having a thickness of less than 300 Å is deposited over dielectric layer 12 and metallization layer 14 as shown by process step 44. An IMD or ILD layer 18 is then deposited according to process step 46, followed by the deposition and patterning of a resist layer 20, as shown at step 48. The IMD layer 18 is then etched (step 50) and the resist and exposed portions of stop layer 32 are removed by the ashing process indicated at step 52. Finally, the trenches and vias are filled with a metal, such as copper, as shown at step 54.

Figure 3B:
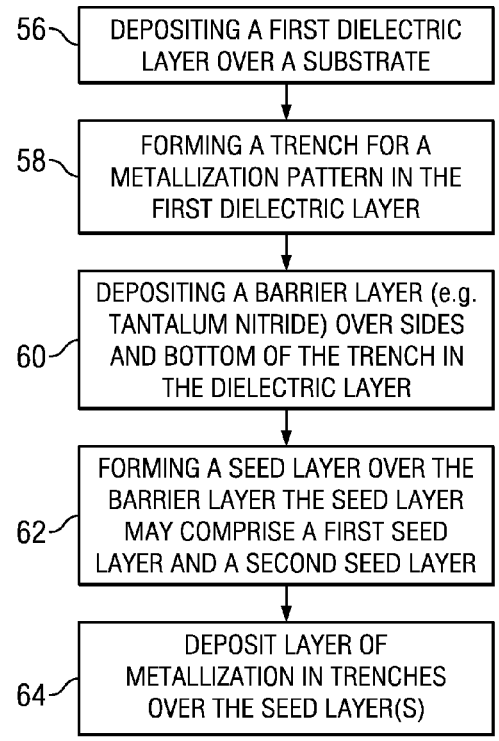

FIG. 3B illustrates details comprising the steps for providing the substrate 10 shown at step 42 of FIG. 3A. As shown, a first dielectric layer is deposited over the substrate as shown at step 56. Then, in a manner well know by those skilled in the art, a trench for the metallization layer is formed as indicated at step 58. A barrier layer 28, such as tantalum nitride, is then deposited over the sides and bottom of the trench as indicated at step 60. The barrier layer 28 is then followed by a seed layer 30, which may be comprised of a first seed layer and a second seed layer as indicated by step 62. Finally, a suitable metal, such as copper, aluminum, gold, silver, tungsten, or tantalum nitride, is deposited in the trenches to form the first level of metallization.

The scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for processing a semiconductor structure defining a metallization layer which results in said metallization layer being substantially free of damage comprising the steps of:

capping a top surface of said semiconductor structure that defines said metallization layer with a thin stop layer, wherein said thin stop layer comprises an organic material;

forming a dielectric layer over said thin stop layer;

patterning said dielectric layer to expose at least one area wherein said thin stop layer is exposed, wherein said step of patterning said dielectric layer is performed according to a patterned resist layer, said patterned dielectric layer defining a layout for an upper level of metallization, and wherein said step of patterning said dielectric layer comprises:

patterning an upper portion of said dielectric layer using a process gas comprising $O_2$ and $F_2$; and patterning a lower portion of said dielectric layer using etchant gases free from oxygen; and removing said exposed thin stop layer to expose a top surface of said metallization layer using etchant gases free from oxygen, so that said metallization layer is substantially free of damage, wherein said step of removing said exposed thin stop layer further comprises removing said patterned resist layer.

2. The method of claim 1, wherein said lower portion of said dielectric layer has a thickness of less than about 400 Å.

3. The method of claim 1, wherein said thin stop layer is deposited to a thickness of less than about 300 Å.

4. The method of claim 1, wherein said thin stop layer is deposited to a thickness of less than about 100 Å.

5. The method of claim 1, wherein said thin stop layer comprises SiOCH.

6. The method of claim 1, wherein said thin stop layer is multilayered.

7. The method of claim 1, wherein said thin stop layer is deposited by at least one of the processes selected from the group consisting of PVD (Plasma Vapor Deposition), CVD (Chemical Vapor Deposition), ALD (Atomic Layer Deposition), and Ion Beam Deposition.

8. The method of claim 1, wherein said thin stop layer is deposited at a temperature of between about 200° C. and about 500° C.

9. A method of forming an upper level of metallization in a semiconductor device with reduced damage to a lower level of metallization comprising the steps of:

providing a substrate having a top surface, said top surface defining said lower level of metallization;

capping said lower level of metallization with a stop layer deposited to a thickness of less than 100 Å over said top surface;

depositing an inter-metal dielectric (IMD) layer over said stop layer;

depositing and patterning a resist layer to define a patterned mask over said IMD layer;

etching an upper portion of said IMD layer to remove material according to said patterned mask using an oxygen-containing and fluorine-containing etchant gas;

etching a lower portion of said IMD layer to remove material according to said patterned mask using an oxygen-free etchant gas to expose said stop layer;

removing said resist layer;

removing said exposed stop layer using an additional etchant gas free from oxygen; and filling an opening formed in said step of etching said upper portion of said IMD layer with a metal to form said upper level of metallization.

10. The method of claim 9, wherein said steps of etching said upper and lower portions of said IMD layer use time-mode.

11. The method of claim 9, wherein said upper portion and said lower portion of said IMD layer are formed of a same material with no etch stop layer formed of a different material therebetween.

12. The method of claim 9, wherein said oxygen-containing etchant gas is selected from the group consisting essentially of $O_2$ and $F_2$ containing gases and combinations thereof.

13. The method of claim 9, wherein said lower portion of said IMD layer has a thickness of less than 400 Å.

* * * * *